US012659613B2

(12) United States Patent
Zhu et al.

(10) Patent No.: US 12,659,613 B2
(45) Date of Patent: Jun. 16, 2026

(54) INTERLEAVING SWITCH CAP INTEGRATOR DAC FOR LOW NOISE RAMP GENERATION WITH LOWER AVDD POWER SUPPLY

(71) Applicant: OMNIVISION TECHNOLOGIES, INC., Santa Clara, CA (US)

(72) Inventors: Fan Zhu, Danville, CA (US); Yunyi Wang, Santa Clara, CA (US); Jiayu Guo, Milpitas, CA (US); Yu-Shen Yang, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 22 days.

(21) Appl. No.: 18/926,079

(22) Filed: Oct. 24, 2024

(65) Prior Publication Data

US 2026/0122367 A1 Apr. 30, 2026

(51) Int. Cl.
*H04N 25/616* (2023.01)
*H03M 1/66* (2006.01)
*H04N 25/709* (2023.01)
*H04N 25/78* (2023.01)

(52) U.S. Cl.
CPC ............ *H04N 25/616* (2023.01); *H03M 1/66* (2013.01); *H04N 25/709* (2023.01); *H04N 25/78* (2023.01)

(58) Field of Classification Search
CPC .... H04N 25/616; H04N 25/709; H04N 25/78; H03M 1/66
See application file for complete search history.

(56) References Cited

U.S. PATENT DOCUMENTS

| | | | |
|---|---|---|---|
| 10,291,251 B1 * | 5/2019 | Innocent | H03M 1/466 |
| 2006/0055577 A1 * | 3/2006 | Boemler | H04N 25/78 |
| | | | 341/155 |
| 2009/0102695 A1 * | 4/2009 | Kawahito | H03M 1/08 |
| | | | 341/172 |
| 2012/0194367 A1 * | 8/2012 | Wang | H03M 1/1014 |
| | | | 341/158 |
| 2018/0367160 A1 * | 12/2018 | Osawa | H04N 25/767 |
| 2019/0020841 A1 * | 1/2019 | Osawa | H03M 1/182 |
| 2019/0115931 A1 * | 4/2019 | Hurwitz | H04N 25/78 |

(Continued)

*Primary Examiner* — Twyler L Haskins
*Assistant Examiner* — John H Morehead, III
(74) *Attorney, Agent, or Firm* — Christensen O'Connor Johnson Kindness PLLC

(57) ABSTRACT

Disclosure relates to interleaving switch cap integrator DAC for low noise ramp generation with lower AVDD power supply. Embodiments of interleaving switch cap integrator digital-to-analog converter (DAC) for low noise ramp generation while operating with low power supply voltage are described. In one embodiment, an image sensor includes: a plurality of pixels arranged in rows and columns of a pixel array; a bitline electrically coupled to an active pixel; and a switched capacitor current digital to analog converter (IDAC) coupled to the bitline. The IDAC includes a plurality of switch banks, where each switch bank is configured to receive a control signal for controlling opening and closing of switches of the switch bank. The control signals are offset in time. An integrator is coupled to the plurality of switch banks. The integrator is configured for generating an output signal based on input signals received from the plurality of switch banks.

19 Claims, 17 Drawing Sheets

(56)             References Cited

U.S. PATENT DOCUMENTS

| | | | |
|---|---|---|---|
| 2023/0188865 A1* | 6/2023 | Hsieh | H04N 19/124 |
| | | | 348/222.1 |
| 2023/0353907 A1* | 11/2023 | Moue | H04N 25/78 |
| 2023/0370740 A1* | 11/2023 | Cai | H04N 25/78 |
| 2024/0069173 A1* | 2/2024 | Chung | G01S 7/4865 |

* cited by examiner

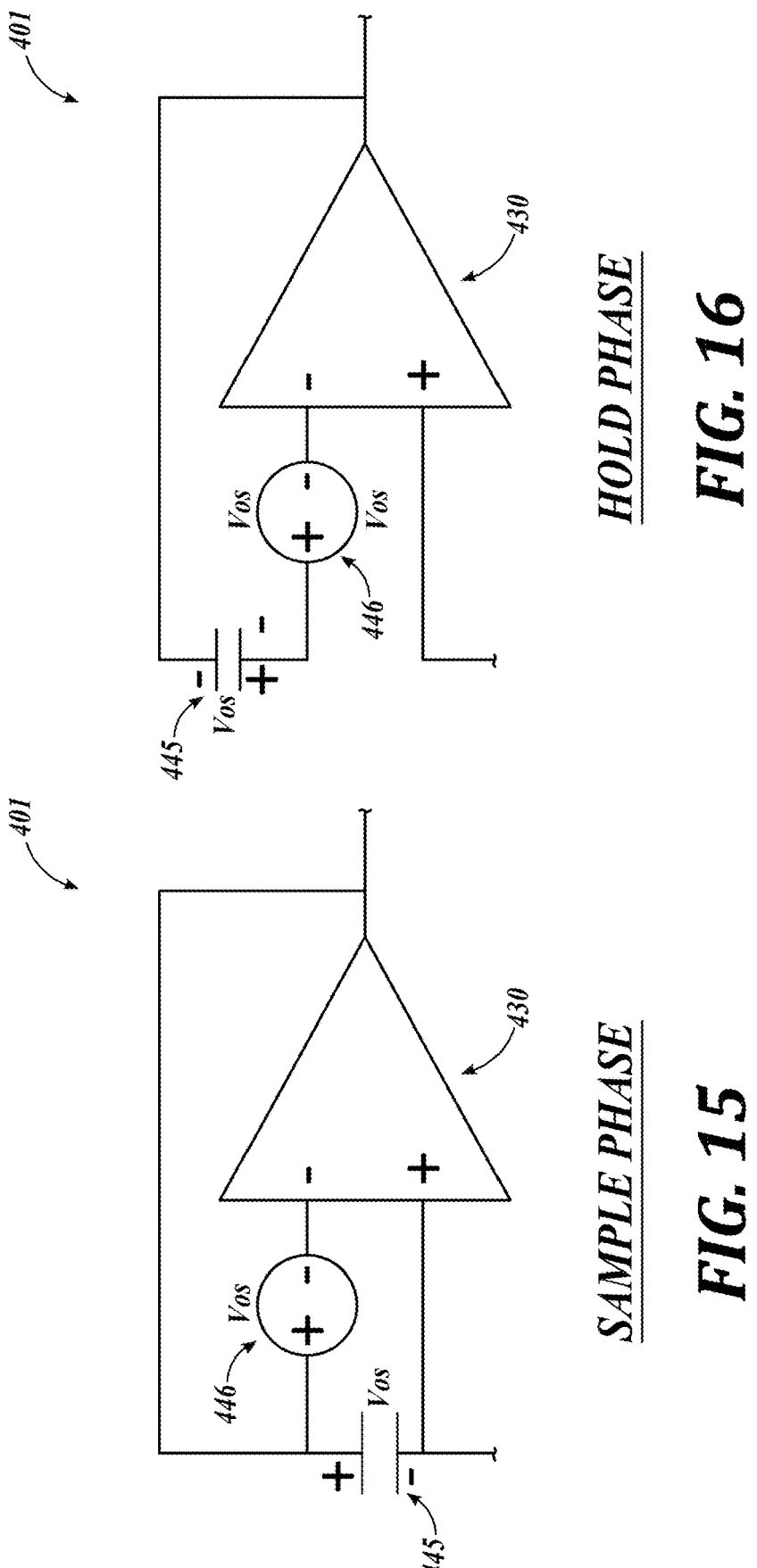
_HOLD PHASE_
_FIG. 16_
_SAMPLE PHASE_
_FIG. 15_

INTERLEAVING SWITCH CAP INTEGRATOR DAC FOR LOW NOISE RAMP GENERATION WITH LOWER AVDD POWER SUPPLY

BACKGROUND INFORMATION

Field of Disclosure

This disclosure relates generally to image sensors, and in particular to interleaving switch cap integrator digital-to-analog converter (DAC) for low noise ramp generation while operating with low power supply voltage.

Background

Image sensors have become ubiquitous. They are widely used in digital still cameras, cellular phones, and security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

A typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

Integrated circuit (IC) technologies for image sensors are constantly improving, especially to increase resolution and to lower power consumption. Such improvements frequently involve scaling down device geometries to achieve lower fabrication costs, higher device integration density, higher speeds, and better performance. Furthermore, power supply voltages for operation of the image sensors (e.g., operation during the readout of the pixel voltages) are generally becoming lower and lower in each new manufacturing node. This constant trend of lowering the power supply voltage results in proportionally smaller budgets for the voltage noise in the system. Therefore, systems and methods are needed for improved handling of the voltage noise in image sensors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 15 and 16 illustrate sample and hold phases, respectively, for buffers A, B, and C shown in FIG. 9.

Figure 1:
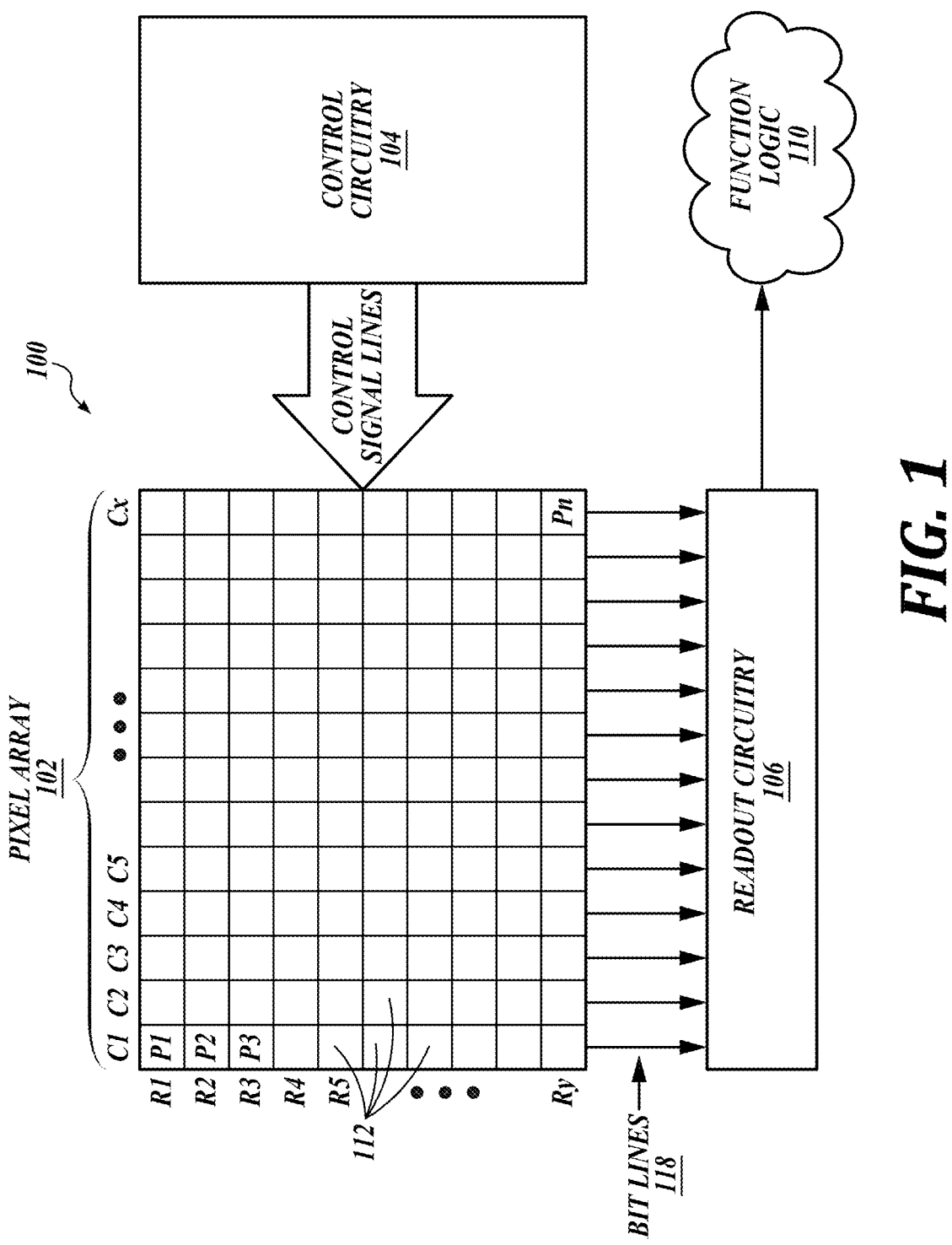
FIG. 1 is an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors having improved photodiode readout, therefore resulting in a more precise digital-to-analog (DAC) conversion of the image sensor's pixel voltages, are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, examples in accordance with the teachings of the present technology are directed to sensing and recording voltage values from the photodiodes based on a correlated double sampling (CDS) technique. Generally, the accuracy of the CDS readout depends on the accuracy of the Vx (pixel voltage) and the slope of the Vy (ramp voltage). However, as the power supply voltage (AVDD) is lowered in the newer image sensor manufacturing nodes, the circuit components also have a lower voltage budget for their operation. For example, lowering the AVDD from 2.8 V down to 2.2 V correspondingly reduces the voltage budget for the cascade current source (e.g., an op-amp integrator) from 0.7 V to 0.55 V, which is a 27.27% voltage shrink. Smaller voltage budgets become a challenge for the current source noise performance, requiring transistors with a bigger width/ length (W/L) and a bigger transconductance (gm) if the electrical current is to be kept the same.

In some embodiments, digital-to-analog converters (DACs) based on switch capacitors may be used with the lower voltage budgets. Such switched capacitor current DACs (IDACs) may be multiplying DAC (MDAC) structures or 1-bit switched-capacitor DACs (SC-DACs) circuits to better handle reduced voltage headroom with reduced noise budgets. For example, several switch banks can be arranged in parallel and be driven by time-offset control signals to provide higher input currents to the integrating capacitor of the op-amp based integrator. Such time offset can be selected to correspond to T/N, where T is the time period of the input control signal, and N is the number of the switch banks that are arranged in parallel.

In some embodiments, the switched capacitor IDACs include additional buffers to better control voltage set points. These buffers may be selectively turned on and off during the sample and hold phases of the CDS cycle. In some embodiments, capacitors of the switched capacitor IDACs are Metal-Oxide-Metal (MOM) interdigitated capacitors with reduced parasitic capacitance.

FIG. 1 illustrates an example imaging system 100 in accordance with an embodiment of the present disclosure. The imaging system 100 includes pixel array 102, control circuitry 104, readout circuitry 106, and function logic 110. In one example, the pixel array 102 is a two-dimensional (2D) array of photodiodes, or image sensor pixels 112 (e.g., pixels P1, P2 . . . , Pn). As illustrated, the photodiodes are arranged into rows (e.g., rows R1 to Ry) and columns (e.g., column C1 to Cx). In operation, the photodiodes acquire image data of a person, place, object, etc., which can then be used to render a 2D image of the person, place, object, etc. However, the photodiodes do not have to be arranged into rows and columns and may take other configurations.

In an embodiment, after each pixel 112 in pixel array 102 has acquired its image data or image charge, the image data is read out by a readout circuitry 106 via bitlines 118, and then transferred to a function logic 110. In various embodiments, the readout circuitry 106 may include signal amplifiers, analog-to-digital (ADC) conversion circuitry, and data transmission circuitry. The function logic 110 may store the image data or even manipulate the image data by applying post image effects (e.g., crop, rotate, remove red eye, adjust brightness, adjust contrast, or otherwise). In some embodiments, the control circuitry 104 and function logic 110 may be combined into a single functional block to control the capture of images by the pixels 112 and the readout of image data from the readout circuitry 106. The function logic 110 may be a digital processor. In one embodiment, the readout circuitry 106 may readout a row of image data at a time along readout column lines (as illustrated) or may readout the image data using a variety of other techniques (not illustrated), such as a serial readout or a full parallel readout of all pixels simultaneously.

In one embodiment, the control circuitry 104 is coupled to the pixel array 102 to control operation of the plurality of photodiodes in the pixel array 102. For example, control circuitry 104 may generate a shutter signal for controlling image acquisition. In one embodiment, the shutter signal is a global shutter signal for simultaneously enabling all pixels within pixel array 102 to simultaneously capture their respective image data during a single acquisition window. In another embodiment, the shutter signal is a rolling shutter signal such that each row, column, or group of pixels is sequentially enabled during consecutive acquisition windows. In another embodiment, image acquisition is synchronized with lighting effects such as a flash.

In one embodiment, data transmission circuitry 108 may receive image data from analog-to-digital converters (ADCs), thus converting analog image data into digital representations of the same. The digital representation of the image data is provided to the function logic 110. In some embodiments, the data transmission circuitry 108 may receive the digital representations of the image data from the ADCs in parallel and provide the same to the function logic 110 in series.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
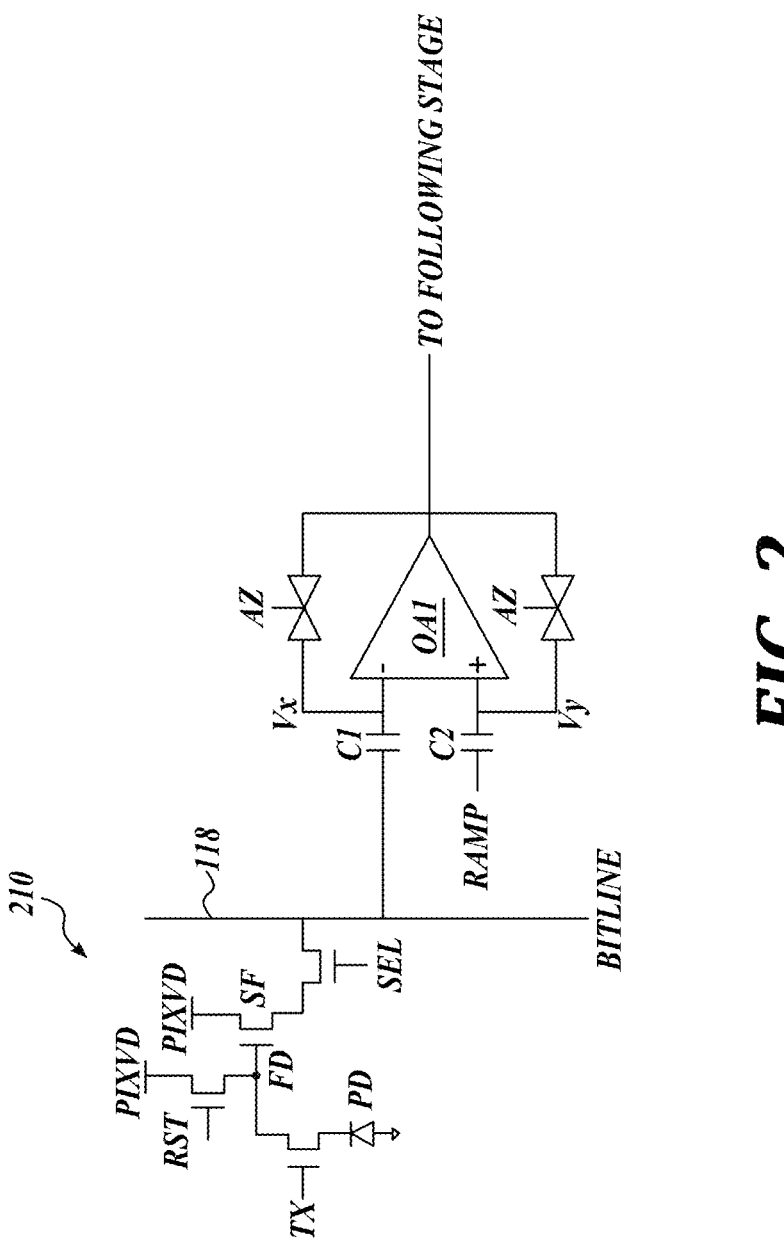
FIG. 2 is a circuit diagram of a sample four transistor (4T) pixel cell in accordance with an embodiment of the present technology.

FIG. 2 is a circuit diagram of a sample four transistor (4T) pixel cell in accordance with an embodiment of the present technology. It is appreciated that pixel cell 210 of FIG. 2 may be an example of a pixel cell 110 of FIG. 1, and that similarly named and numbered elements referenced below may be coupled and function similarly. For example, the pixel cell 210 may be coupled to a bitline 118, e.g., readout column, which may provide image data to readout circuitry, such as the readout circuitry 106. The pixel cell 210 may receive signals from control circuitry, such as control circuitry 104, to control the operation of the various transistors of the pixel cell 210. The control circuitry may control the operation of the transistors in desired sequences with relative timing in order to reset the pixel to a dark state and to read out image data after an integration, for example.

The illustrated example of the pixel cell 210 includes a photosensitive or photoelectric conversion element, such as a photodiode PD. In operation, the photodiode PD photogenerates an image charge in response to incident light.

Pixel cell 210 also includes a transfer gate TX and floating diffusion FD. In operation, a transfer gate TX transfers image charge from the photodiode PD to the floating diffusion FD in response to a transfer gate signal. A reset transistor RST couples a power supply voltage PIXVD (also referred to as VDD) to the floating diffusion FD to reset the pixel cell 210 (e.g., to discharge or charge the photodiode and the floating diffusion to a preset voltage) in response to a reset signal. The gate terminal of an amplifier transistor SF (also referred to as a source follower) is also coupled to the floating diffusion FD to generate an image data signal in response to the image charge in the floating diffusion FD. A row select transistor SEL (also referred to as RS) is coupled to the source follower SF to output the image data signal to an output bitline 118.

The image data signal is further routed to a capacitor C1 of a comparator (e.g., an operational amp) OA1. The voltage that the comparator OA1 senses at this input is Vx. The other input of the comparator OA1 is a ramp voltage Vy. In operation, the comparator OA1 is first self-reset (auto-zero or AZ) at the RST level of the pixel PD through corresponding transmission gates, which are auto-zero switches that switch in response to the AZ signal. The switches reset the input and output of OA1 to the same voltage. Subsequently, an AD conversion is conducted to digitize the pixel RST voltage. Afterwards, transfer gate TX is turned-on, allowing the electrons accumulated in the photodiode PD to be transferred out onto the floating diffusion FD node. Then another AD conversion is conducted to digitize the pixel's signal voltage level, using a voltage ramp that is further described below. The digitized signal can next be transferred to a following stage of the readout circuit.

Figure 3:
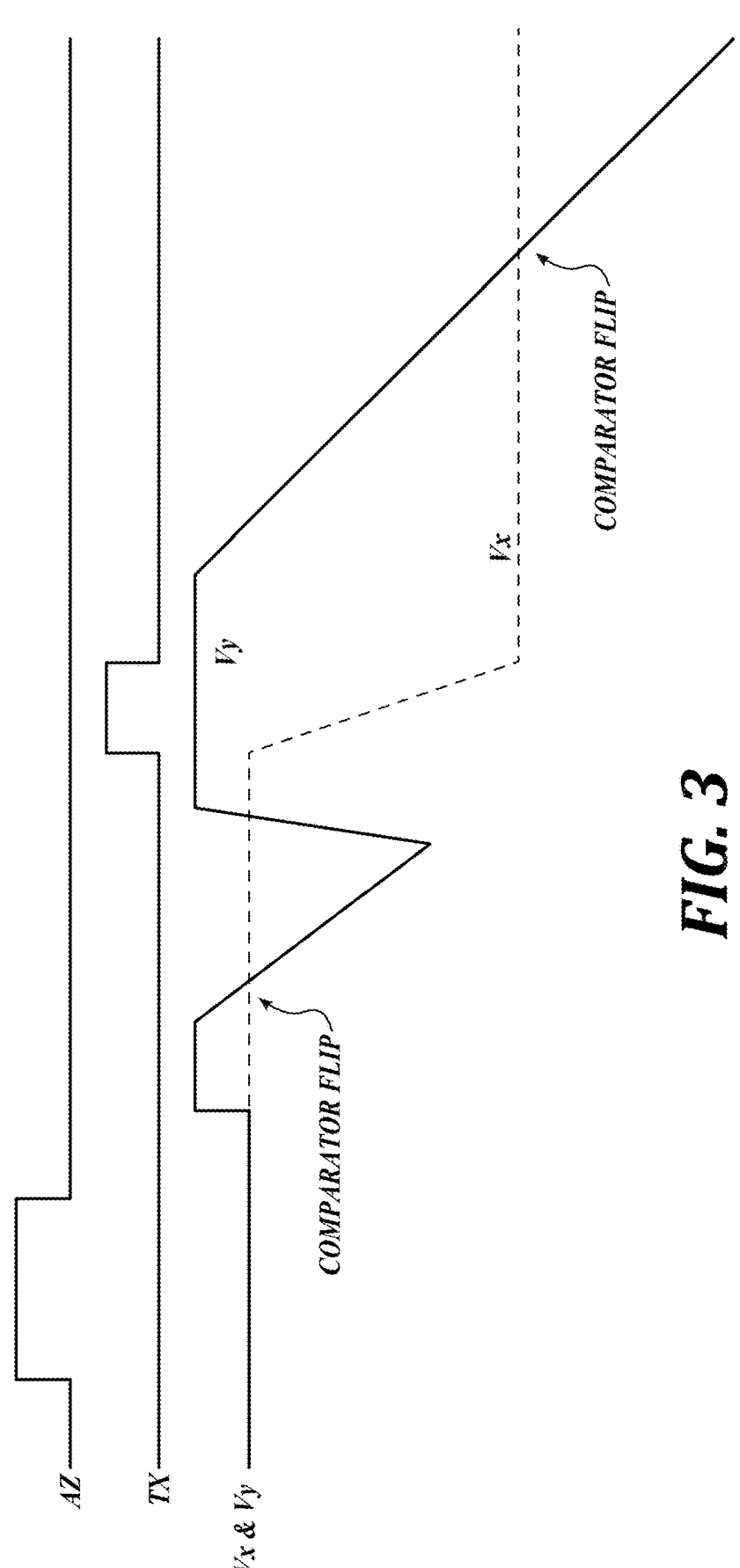
FIG. 3 is an example timing diagram for the sample pixel cell of FIG. 2.

FIG. 3 is an example timing diagram for the sample pixel cell of FIG. 2. Four signals are shown: auto-zero (AZ), transfer (TX), Vy (ramp voltage) and Vx (pixel voltage). In operation, the comparator is first self-reset (auto-zero or AZ) at the RST level of the pixel. In the illustrated embodiment, one AD conversion is conducted to digitize the pixel RST voltage (the first "comparator flip" on the timing diagram). Afterwards, the transfer gate TX is turned-on, allowing the electrons accumulated in the photodiode to be transferred out to the floating diffusion (FD) node. As the electrons accumulate at the FD node, Vx is brought down to its steady value, and AD conversion may start by lowering Vy till the two voltages intersect (second "comparator flip" in the timing diagram). These two AD conversions constitute a correlated double sampling (CDS) technique. At this point, the pixel's signal voltage level is determined, and may be further processed by, for example, readout circuitry 106 or function logic 110.

Figure 4:
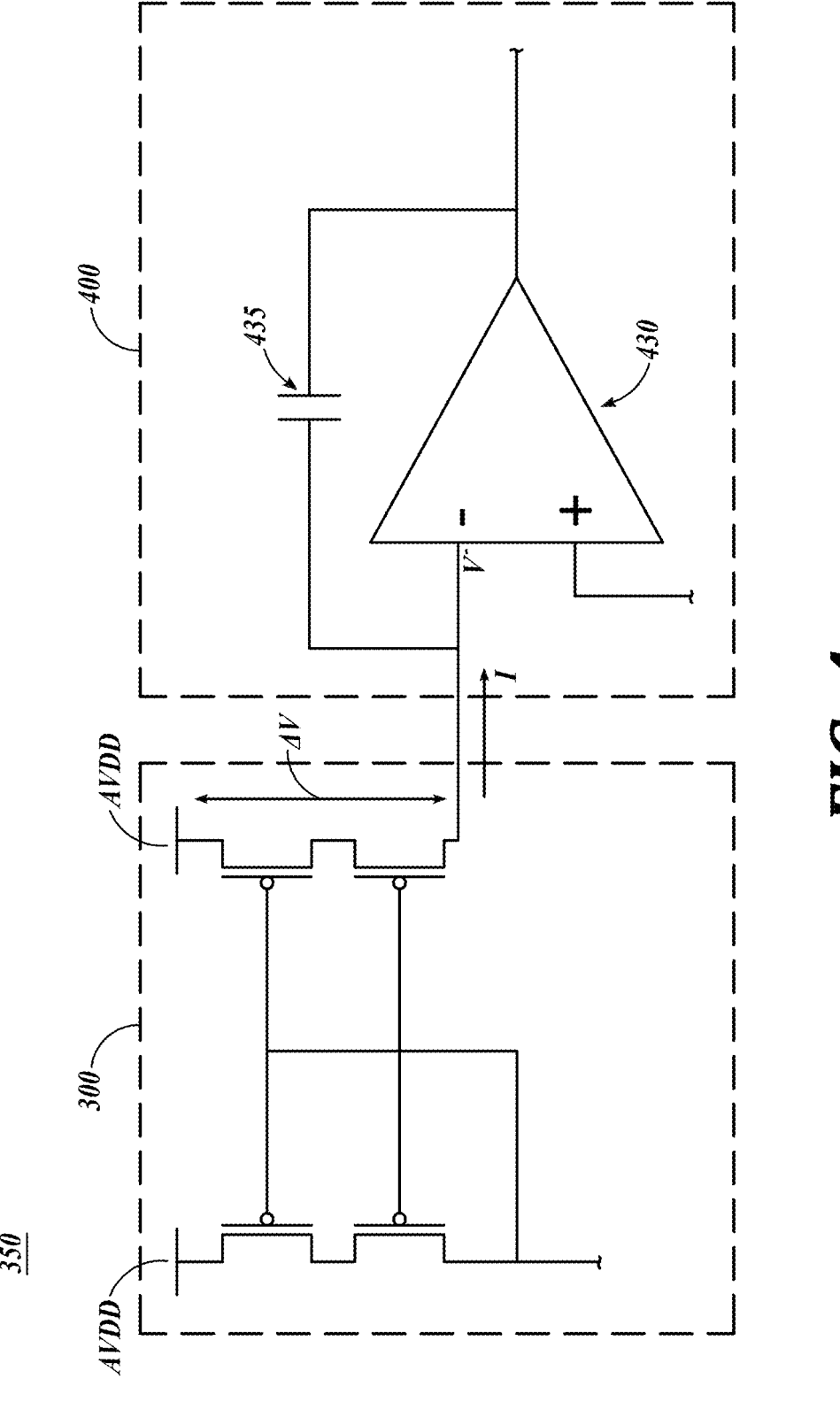
FIG. 4 is a circuit diagram of a sample current mirror based current generator in accordance with an embodiment of the present technology.

FIG. 4 is a circuit diagram of a sample current mirror based current generator in accordance with an embodiment of the present technology. The illustrated current (I) digital to analog converter (DAC) structure (or IDAC for short) includes a current mirror 300 and an integrator 400 that is based on an op-amp 430. However, the supply voltage AVDD is typically reduced from one generation of semiconductor manufacturing technology to another resulting in, for example, a reduction of AVDD from 2.8 V to 2.2 V. Correspondingly, the budget ($\Delta V$) for the non-inverting voltage level $V^-$ at the op-amp 430 may change from $AVDD-V^-=0.7$ V to $AVDD-V^-=0.55$ V, which corresponds to a reduction of voltage budget of about 27%. A person of ordinary skill would know that the above numerical values are provided as example only, and other values of voltage budget reduction are also possible. A person of ordinary skill would also understand that a reduction in the voltage budget becomes a challenge for the current source noise performance, because a smaller voltage budget requires transistors having bigger width/length (W/L) ratio and bigger transconductance (gm) for the same amount of electrical current that is produced. Accordingly, integrators capable of working with lower voltage budget, while having reduced noise performance, are needed.

Figure 5:
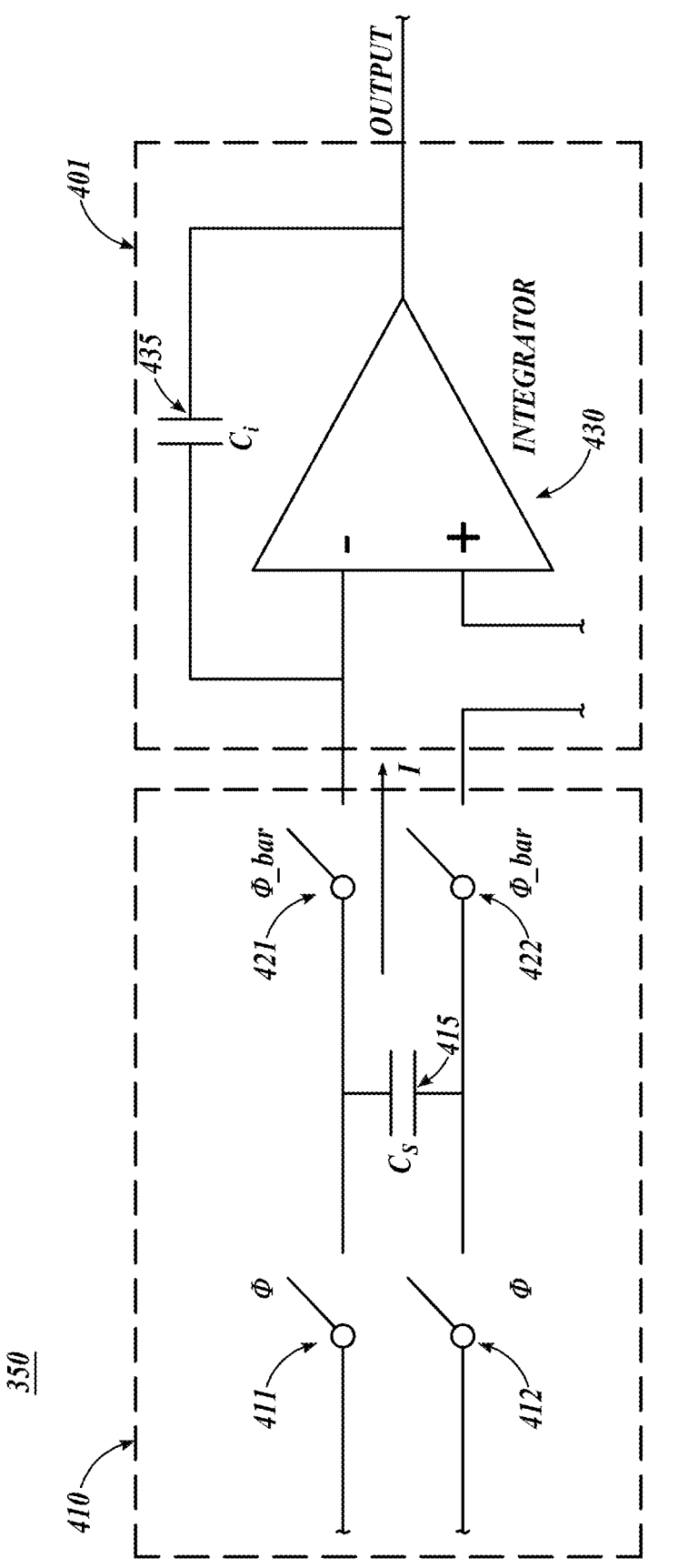
FIG. 5 is a circuit diagram of a switched capacitor current (I) digital to analog converter (DAC) in accordance with an embodiment of the present technology.

FIG. 5 is a circuit diagram of a switched capacitor IDAC in accordance with an embodiment of the present technology. In particular, the illustrated switched capacitor IDAC is a 1-bit switched-capacitor (1-bit SCDAC) structure. The switched capacitor IDAC includes a switch bank 410 and an op-amp based integrator 401. The switch bank 410 includes switches (e.g., transistors) 411 and 421 that are configured on a transmission line connecting to the inverting input of the integrator 401, and switches 412 and 422 that are configured on a transmission line connecting to the non-inverting input of the integrator 401. As a naming convention, the switch 411 may be referred to as a first switch, the switch 412 may be referred to as a second switch, the switch 421 may be referred to as a third switch, and the switch 422 may be referred to as a fourth switch. A channel sample capacitor (Cs) 415 is configured between the inverting and non-inverting transmission lines. In operation, the switches 411, 412 are open when the switches 421, 422 are closed, and vice versa. For example, the operation of the switches 411, 412 may be controlled by a control signal $\Phi$, while the operation of the switches 421, 422 is controlled by a control signal $\Phi\_bar$, which has an opposite timing from that of the control signal $\Phi$. Stated differently, the phases of the control signals $\Phi$ and $\Phi\_bar$ differ by $\pi$ (180 degrees), therefore the control signals $\Phi$ and $\Phi\_bar$ are sometimes referred to as the opposite phase signals. Such opening and closing of the switches results in an electrical current I that charges an integrator capacitor 435 (Ci), as further explained with reference to FIG. 6 below.

Figure 6:
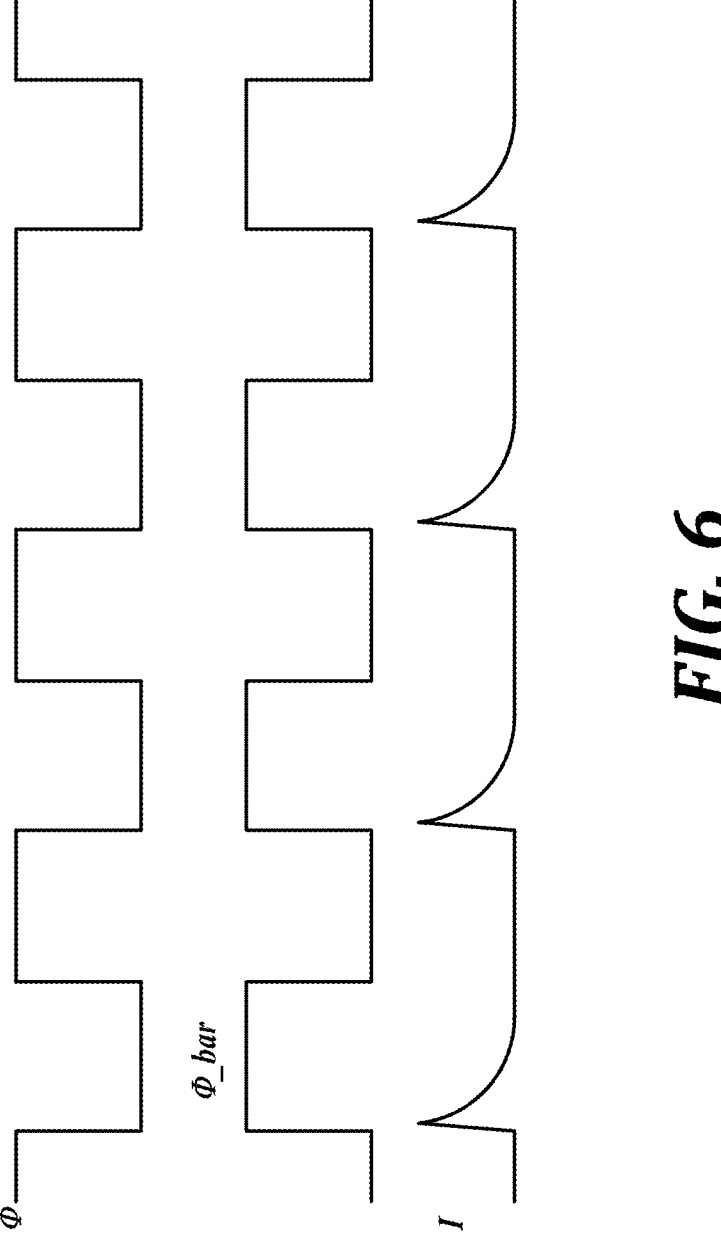
FIG. 6 is an example timing diagram for the sample switched capacitor IDAC of FIG. 5.

FIG. 6 is an example timing diagram for the sample switched capacitor IDAC of FIG. 5. In operation, the capacitor Cs is being charged when the switches 411, 412 are closed (on position) by the control signal $\Phi$ being high, and the switches 421, 422 are open (off position) by the control signal $\Phi\_bar$ being low. In the next half period, the switches 411, 412 are open (off position) by the control signal $\Phi$ being low (thus the current flow into the Cs is interrupted by the switches 411, 412), and the switches 421, 422 are closed (on position) by the control signal Φ_bar being high (thus enabling the current I to flow to the Ci 435). Each closing of the switches 421, 422 results in a peak current I, followed by a relatively rapid decrease in the current I. As a result of a relatively limited total current I, unity-gain bandwidth (UGB) of the integrator 401 is also limited, and the clocking of Φ has to be relatively slow to maintain acceptable level of charging of the Ci 435. In the context of correlated double sampling (CDS) technique, slow or insufficient charging of the Ci 435 may not be capable of generating proper ramping down slopes for the ramp voltage Vy.

Figure 7:
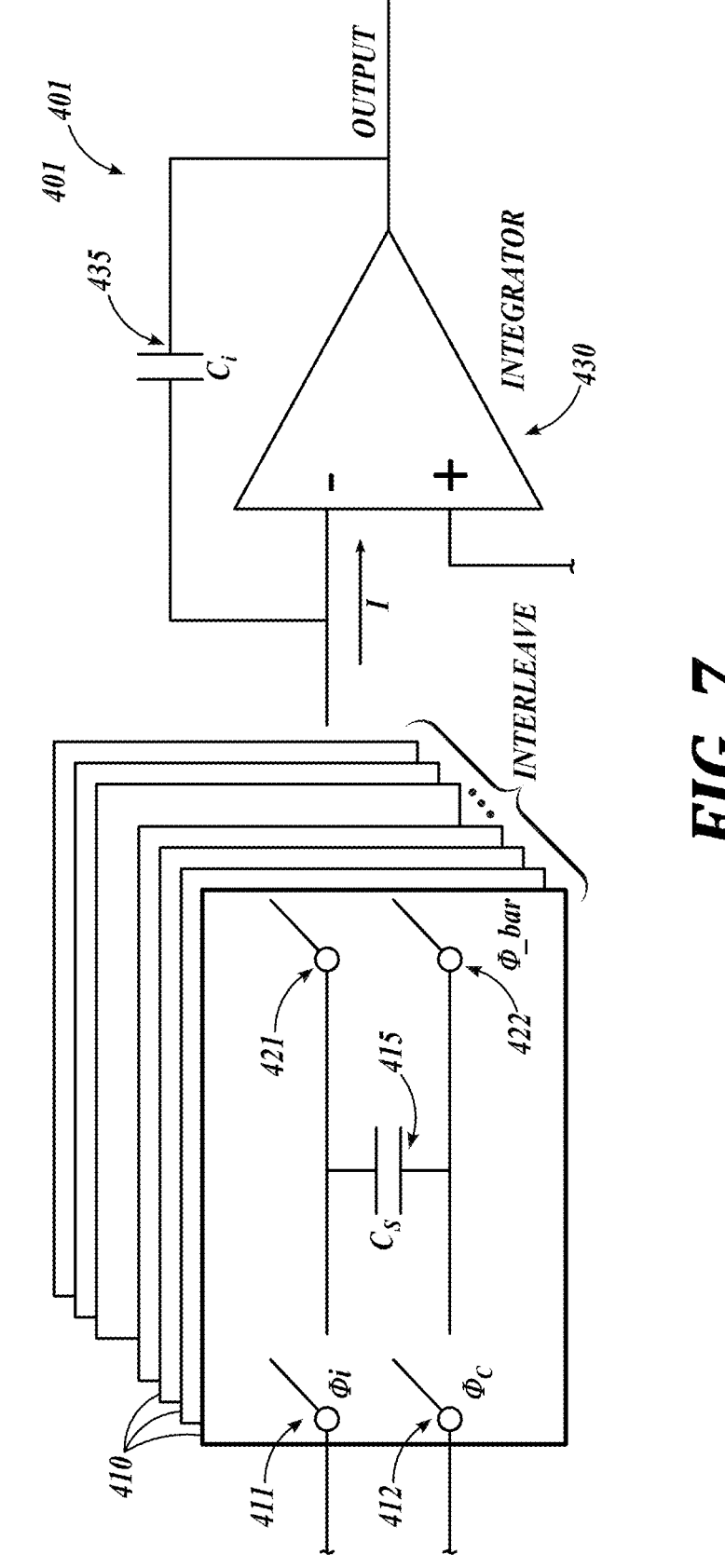
FIG. 7 is a circuit diagram of a switched capacitor IDAC having multiple staggered clock inputs in accordance with an embodiment of the present technology.

FIG. 7 is a circuit diagram of a switched capacitor IDAC having multiple staggered clock inputs in accordance with an embodiment of the present technology. In comparison to the circuit diagram of FIG. 5, the illustrated circuit diagram includes a larger number (N) of the switch banks 410 that are arranged in parallel. When the switch banks 410 operate in parallel, each bank is capable of independently generating current I that is interleaved with other currents I generated by other switch banks, as described with reference to FIG. 8 below.

Figure 8:
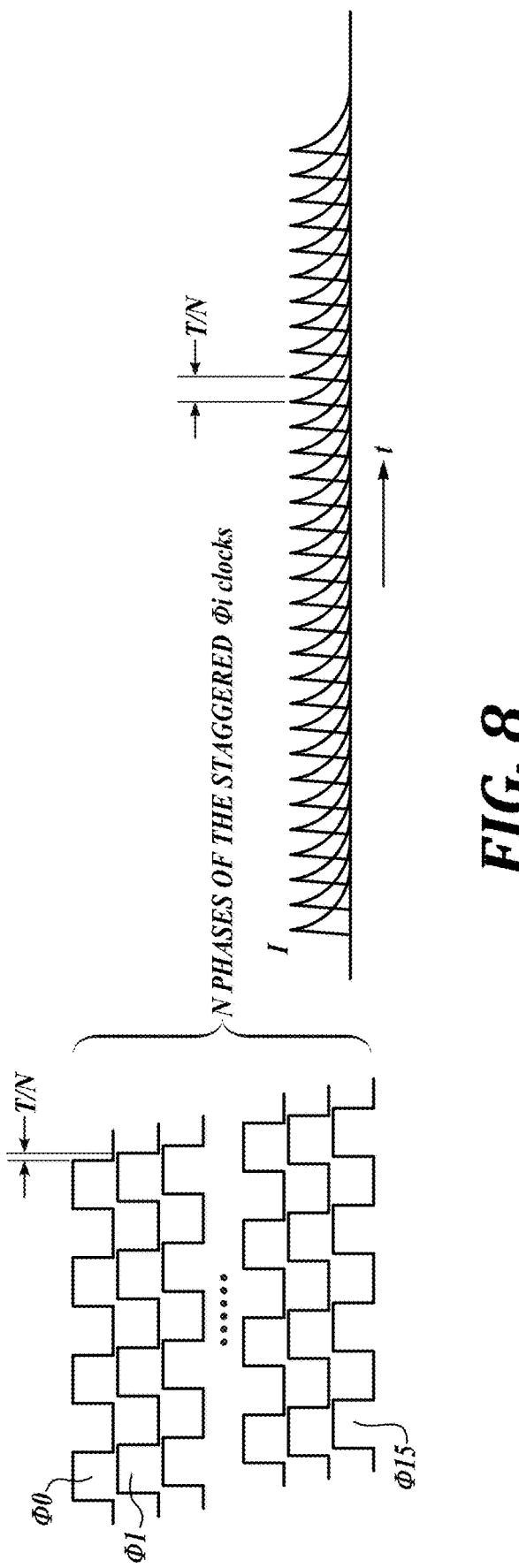
FIG. 8 is an example timing diagram for the sample switched capacitor IDAC of FIG. 7.

FIG. 8 is an example timing diagram for the sample switched capacitor IDAC of FIG. 7. Here, switch banks 410 operate in parallel. Furthermore, control signals Φ and Φ_bar are time-offset (staggered) for each switch bank 410. For example, the time offsets for control signals Φ and Φ_bar may be $\Delta T=T/N$, where T is a period of the control signal and N is the number of the switch banks 410 operating in parallel. In some embodiments, N can correspond to 16, but other numbers of the switch banks 410 operating in parallel are also possible. Offsetting the timing of individual switch banks 410 causes a more "dense" distribution of peak currents I, in turn enabling faster charging of the capacitor Ci. A person of ordinary skill would know that charging of the capacitor Ci scales with a sum of area-under-curves for the individual I contributions of the individual switch banks 410.

Figure 9:
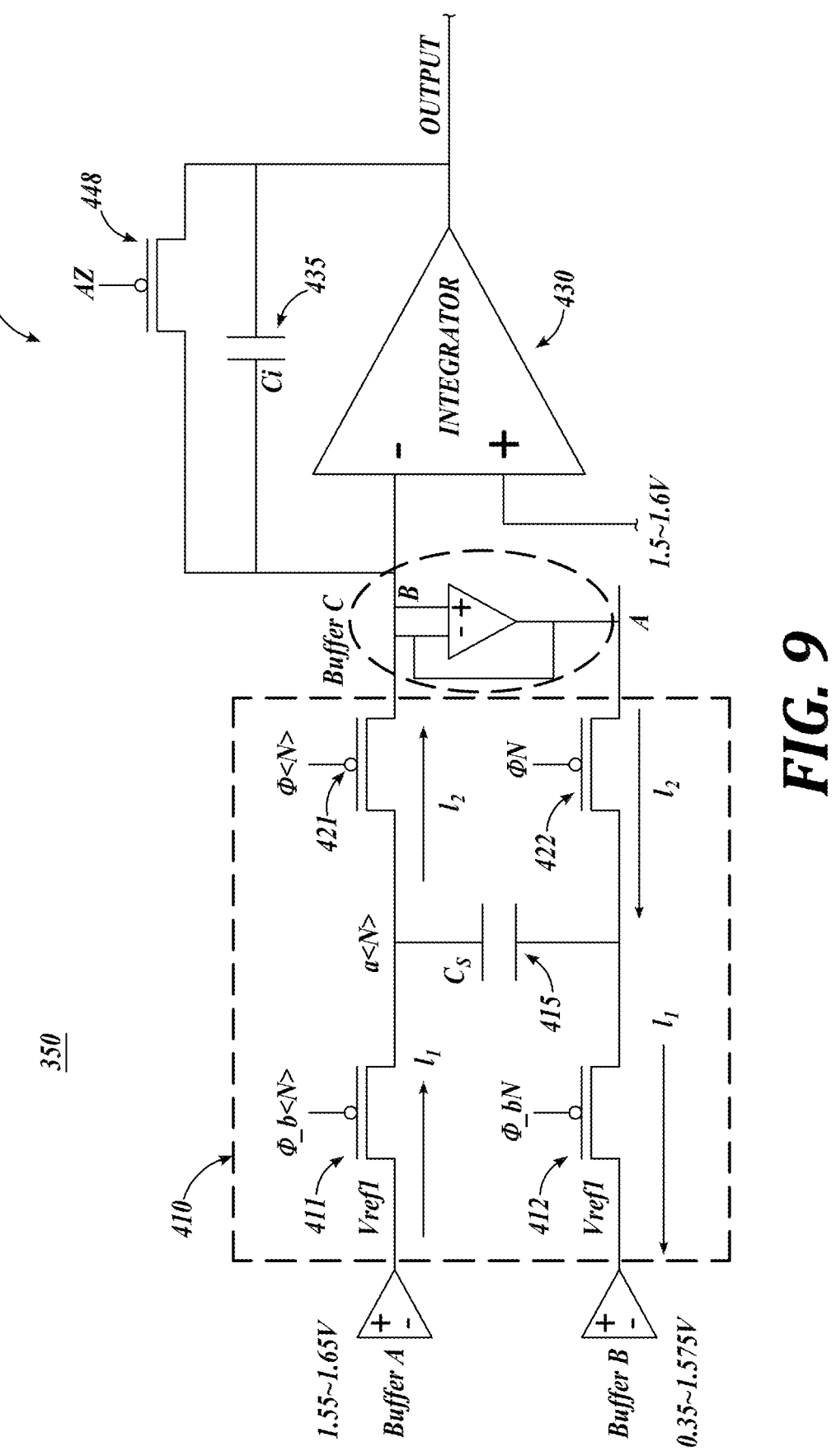
FIG. 9 is a circuit diagram of a switched capacitor IDAC in accordance with an embodiment of the present technology.

FIG. 9 is a circuit diagram of a switched capacitor IDAC in accordance with an embodiment of the present technology. The illustrated circuit generally corresponds to the one shown in FIG. 7, however, buffers A, B and C are added to the circuit diagram in FIG. 9. For simplicity, one individual switch bank 410 is illustrated, but a person of ordinary skill will understand that more switch banks 410 may be added in a parallel arrangement. For example, 16 switch banks 410 or other number of switch banks may be included.

In operation, buffers A (also referred to as first buffers) and B (also referred to as second buffers) provide differential voltage references Vref1 and Vref2 to charge the channel sample capacitor (Cs) 415. These voltage ranges are shown for illustration only, and other voltage ranges are also possible. As before, the switches 411, 412 open and close in an opposite phase from that of the switches 421, 422. The switches 411, 412, 421, and 422 are illustrated as PNP field effect transistors (FETs), however, other types of transistors are also possible in different embodiments. As explained with respect to FIG. 5 above, the opposite phase of the switch opening charges the integrator capacitor Ci. Furthermore, buffer C (also referred to as a third buffer) provides voltage for a node A to assure that the voltage at the node A corresponds to the voltage at a node B, therefore assuring that the channel capacitor Cs is fully discharged and charge carried by Cs will transfer to Ci. In some embodiments, buffer C provides voltage for the node A for the switch banks 410. Operation of the integrator 401 may be controlled by the auto-zero (AZ) signal to a transistor 448.

Figure 10A:
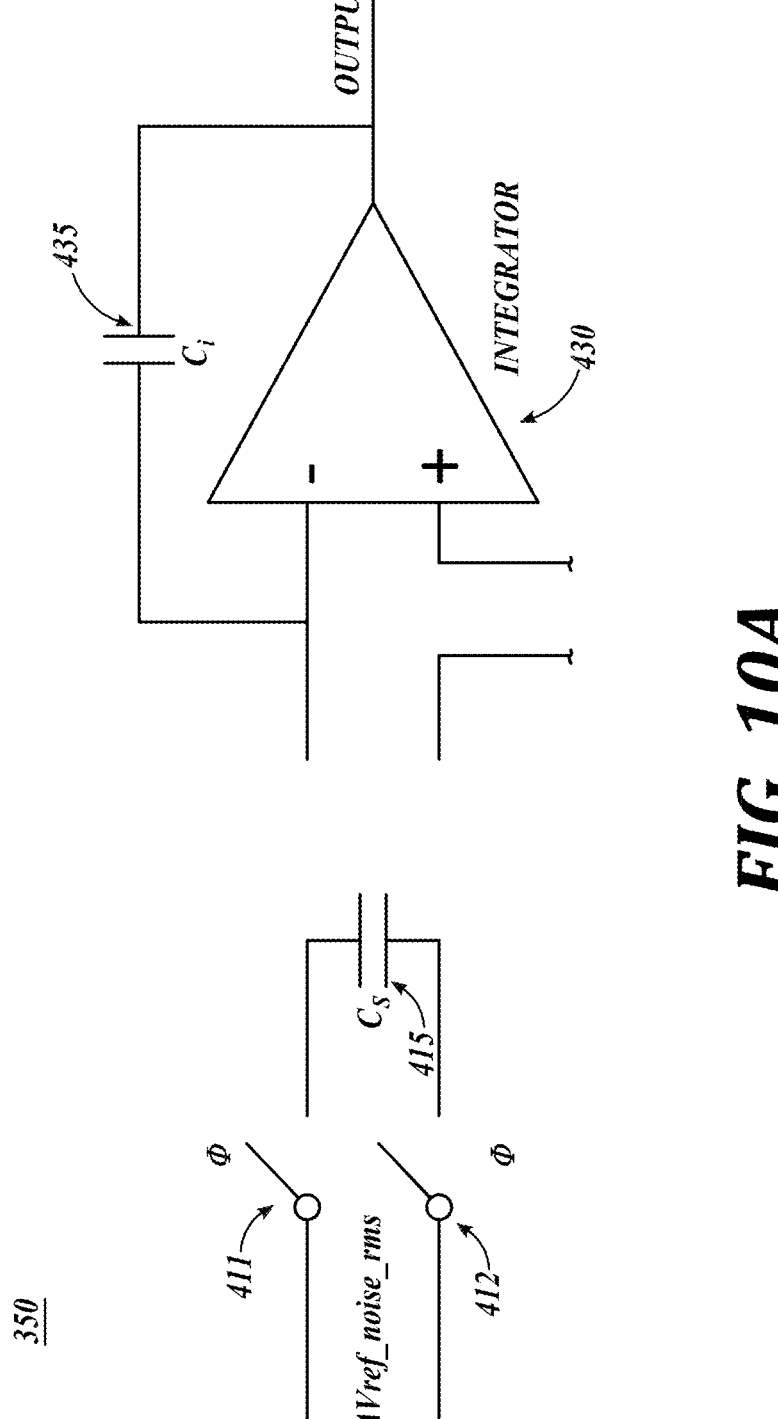
FIGS. 10A and 10B illustrate noise analysis of a switched capacitor IDAC in accordance with an embodiment of the present technology.
Figure 10B:
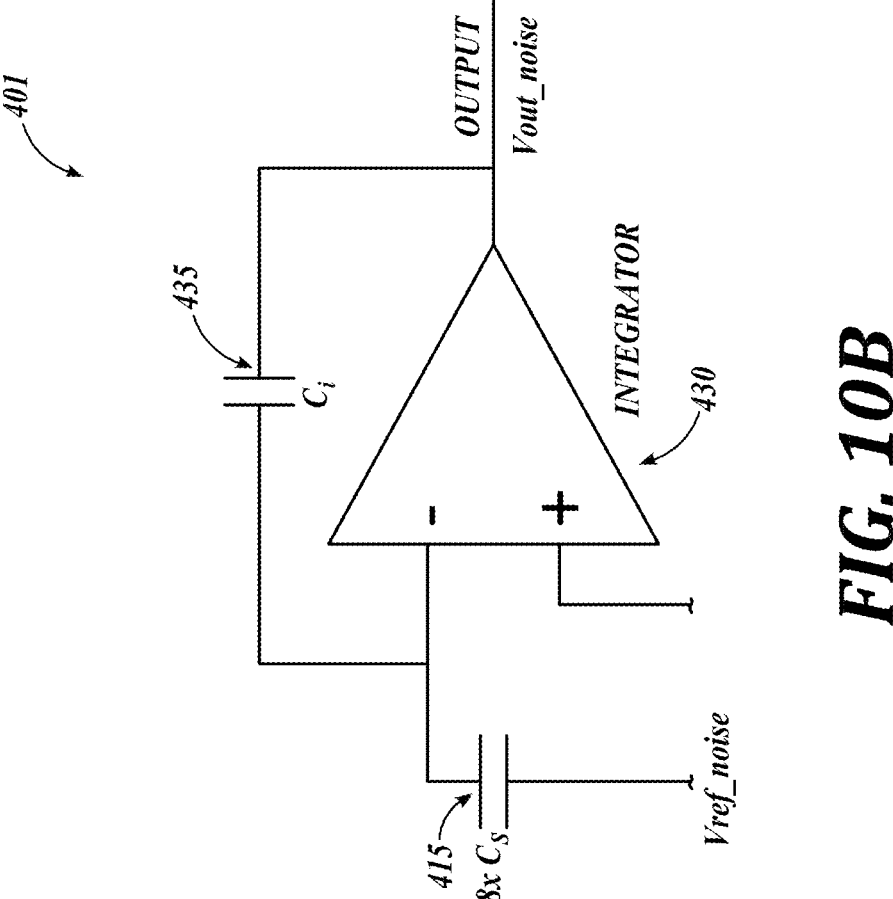

FIGS. 10A and 10B illustrate noise analysis of a switched capacitor IDAC in accordance with an embodiment of the present technology. A person of ordinary skill would understand that the illustrated circuits are somewhat simplified, with a focus on the noise analysis at the channel sample capacitor Cs and the integrator capacitor Ci, therefore neglecting for a moment operation of the switches between the capacitors Cs and Ci.

Turning attention to FIG. 10A and assuming, for example, clock frequency of 1 GHz for control signal Φ (i.e., frequency of opening and closing the switches 411, 412), and also assuming N=16 interleaved switch banks 410, each interleaved switch banks (channel) is time offset by 1/16 GHz. Under this scenario, a sample noise and a thermal noise (KT/C) are as follows. For the black level, if we assume about 500 dn (DDR) to reach the black level, then 500/2 sample and hold actions are needed, and the inserted thermal noise becomes 250*KT/C. The dn can be understood as a count to reach black flip point. Taking FIG. 3 as an example, dn can be understood as a count from the starting point of the ramp down to comparator flip point. Therefore, the IDAC correlated double sampling (CDS) output noise becomes:

$$V\text{out\_}rms\text{\_noise} = \sqrt{250\frac{KT}{Cs}}\left(\frac{Cs}{Ci}\right)\sqrt{2}$$

Furthermore, assuming Cs of about 600 fF and Ci of about 400 pF, Vout rms noise becomes about 2.78 µV after CDS. Since Ci is much larger than Cs (by several orders of magnitude), such attenuation reduces the output noise, while not affecting resolution or accuracy of the CDS output. Therefore, the same conclusion can also be applied to ΔVref_noise_rms, resulting in a requirement to make ΔVref_noise_rms<<KT/C (which is about 164 µV) that makes the ΔVref_noise_rms relatively insignificant in comparison to the thermal noise.

FIG. 10B represents a sample noise analysis for the hold phase of the CDS cycle. Assuming that the channel sample capacitor 415 has a capacitance of 8×Cs, it can be shown that:

$$V\text{out\_noise} = \left(8*Cs/Ci\right)*Vref\text{\_noise}$$

Using a 16-phase switch bank as an example, there will be 8 capacitors charging with buffers A and B and another 8 capacitors discharging with buffer C. Therefore, the above equation "Vout_noise=(8*Cs/Ci)*Vref_noise" determines the output noise contribution from buffer C. For the above values of Cs of about 600 fF and Ci of about 400 pF, the Vout_noise becomes 1/83.3 of the Vref_noise. Stated differently, by Ci being significantly higher than the Cs, the Vref buffer noise is also suppressed by 1/83. A person of ordinary skill would understand that the above numerical values are provided for illustration purposes only, and that other values may apply in different embodiments provided, of course, that the capacitance value of Ci remains significantly higher than the capacitance value of Cs (e.g., higher by an order of magnitude or more).

Figure 11:
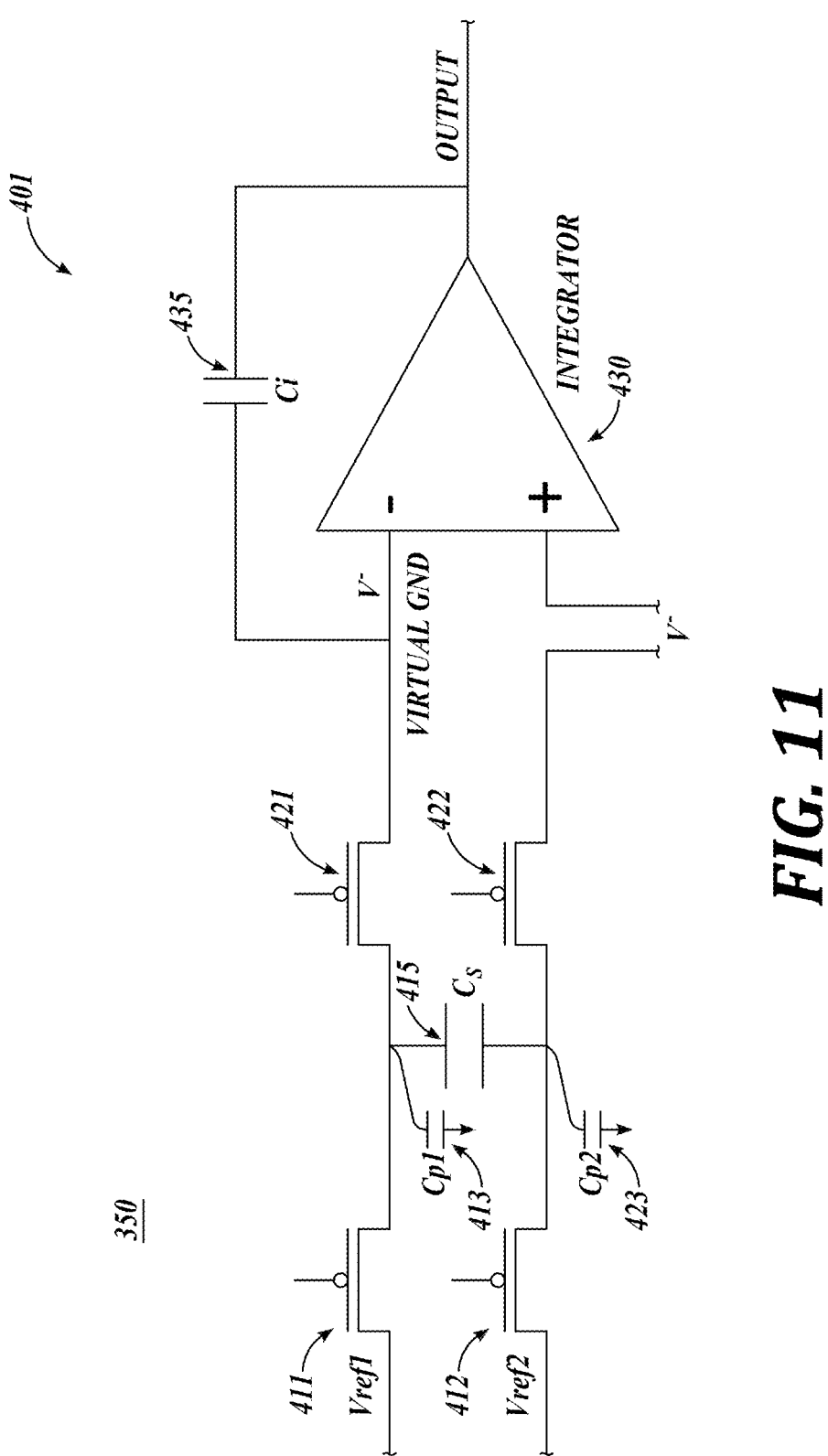
FIG. 11 illustrates switch caps noise analysis for a switched capacitor IDAC in accordance with an embodiment of the present technology.

FIG. 11 illustrates switch caps noise analysis for a switched capacitor IDAC in accordance with an embodiment of the present technology. The illustrated switched capacitor IDAC 401 is similar to those shown in FIGS. 7 and 9. However, in this embodiment, parasitic capacitance is taken into account and analyzed. In particular, parasitic capacitance Cp1 develops on the inverting input side of the channel sample capacitor 415, and parasitic capacitance Cp2 develops on the non-inverting side of the channel sample capacitor 415. A person of ordinary skill would understand that the parasitic capacitances may develop between different metallization layers in the semiconductor device. In the illustrated embodiment, the parasitic capacitance Cp2 generally does not cause any charge error during the sample and hold phases, because Cp2 is not connected to any virtual ground point of the integrator 401 (i.e., to the inverting input of the op-amp 430). However, the parasitic capacitance Cp1 causes a charge error that can be expressed as Cp1*(Vref1−V⁻). In some embodiments, the value of V⁻ may be 1.6 V or 2.1 V, but other values are also possible. For simplicity, one individual switch bank 410 is illustrated, but a person of ordinary skill will understand that more switch banks 410 may be added in a parallel arrangement. For example, 16 switch banks 410 or other number of switch banks may be included. Some approaches to reduce the influence of the parasitic capacitance Cp1 are described with reference to FIGS. 12 and 13 below.

Figure 13:
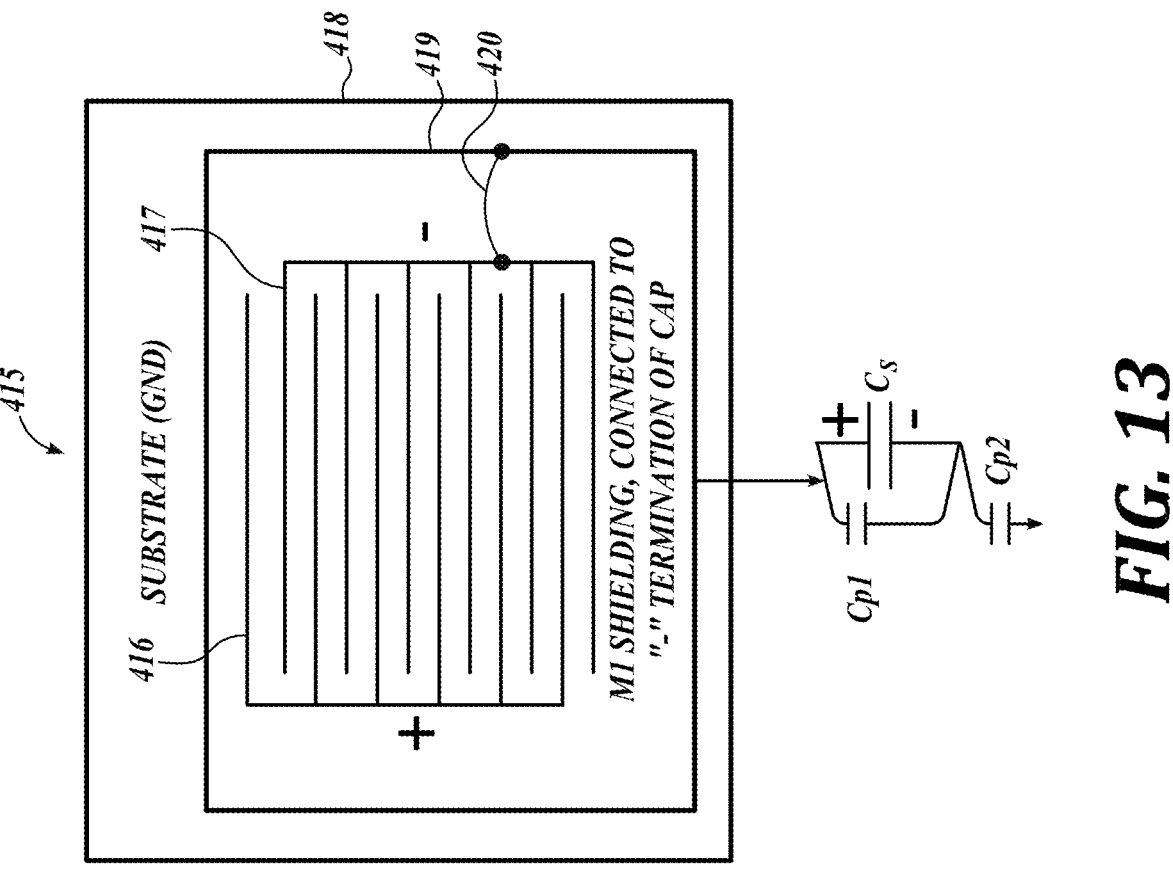
FIGS. 12 and 13 illustrate different design implementations of capacitors of a switched capacitor IDAC in accordance with an embodiment of the present technology.
Figure 12:
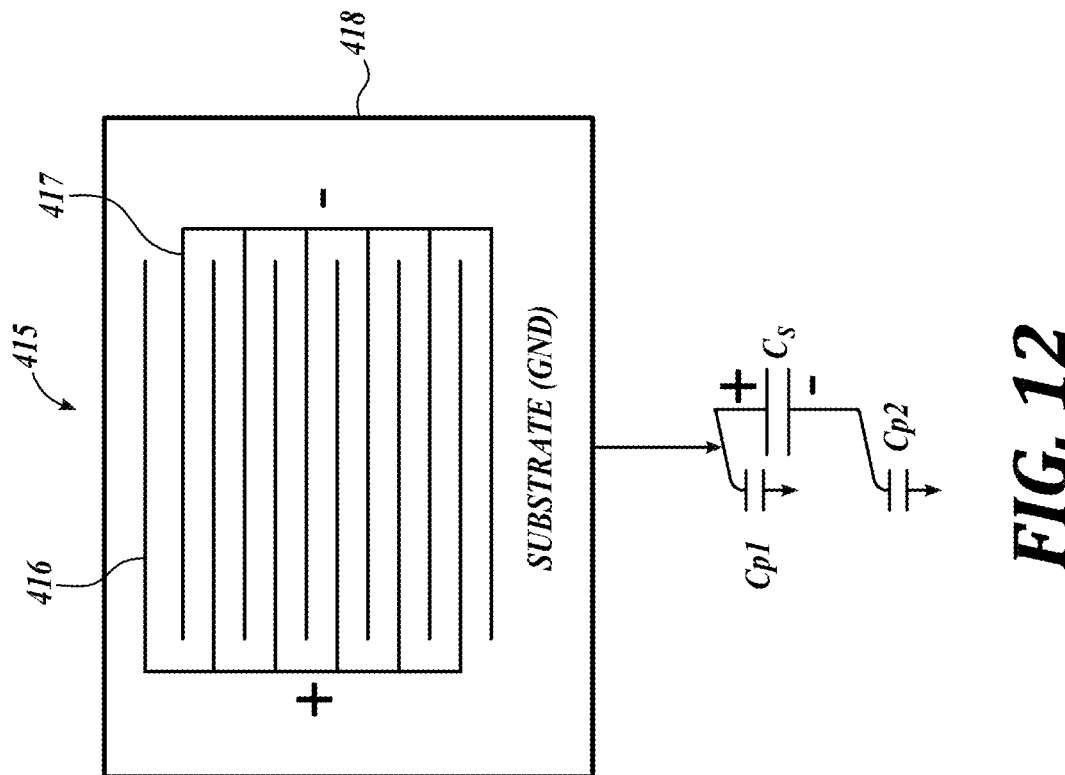

FIGS. 12 and 13 illustrate different design implementations of capacitors of a switched capacitor IDAC in accordance with an embodiment of the present technology. FIG. 12 illustrates a layout of the channel sample capacitor 415. In some embodiments, the physical implementation of the channel sample capacitor 415 includes metallization (e.g., traces) 416 and 417. However, a relatively close vicinity of a ground plane (i.e., substrate) 418 causes additional capacitances, which are annotated as the parasitic capacitances 413 (Cp1) and 423 (Cp2). Since the parasitic capacitance Cp1 causes the charge error Cp1*(Vref1−V⁻), the influence of the parasitic capacitance Cp1 can be reduced by keeping the value of Vref1 as close as possible to the value of V⁻ (voltage at the inverting input terminal of the op-amp). As explained above, parasitic capacitance Cp2 may be neglected in the first order analysis, however, parasitic capacitance Cp1 causes a charge error that remains an issue for the CDS operation.

FIG. 13 illustrates another embodiment of a layout of the channel sample capacitor 415. In the illustrated embodiment, the channel sample capacitor 415 is again physically implemented as a combination of metallization (e.g., traces) 416 and 417. Therefore, presence of the ground (i.e., substrate) 418 again causes additional parasitic capacitances Cp1 and Cp2. However, with the illustrated embodiment, a metal layer (also referred to as 'shielding') 419 is connected by an electrical connection 420 (e.g., a metal via) with, for example, metallization 417 of the channel sample capacitor 415. Such electrical connection causes the parasitic capacitance Cp1 to have one 'plate' (e.g., metallization 416) to be electrically connected with the positive terminal of the channel sample capacitor 415 (Cs), and another 'plate' (e.g., metallization 419) to be electrically connected with the negative terminal 417 of the channel sample capacitor 415, effectively connecting the capacitances Cp1 and Cs into one capacitance made of two capacitors in a parallel layout. Therefore, the parasitic capacitance Cp1 becomes part of the resulting overall Cs. In at least some embodiments, this changed capacitance impacts the range of CDS ramp, but does not impact the fine gains of the CDS operation.

Figure 14:
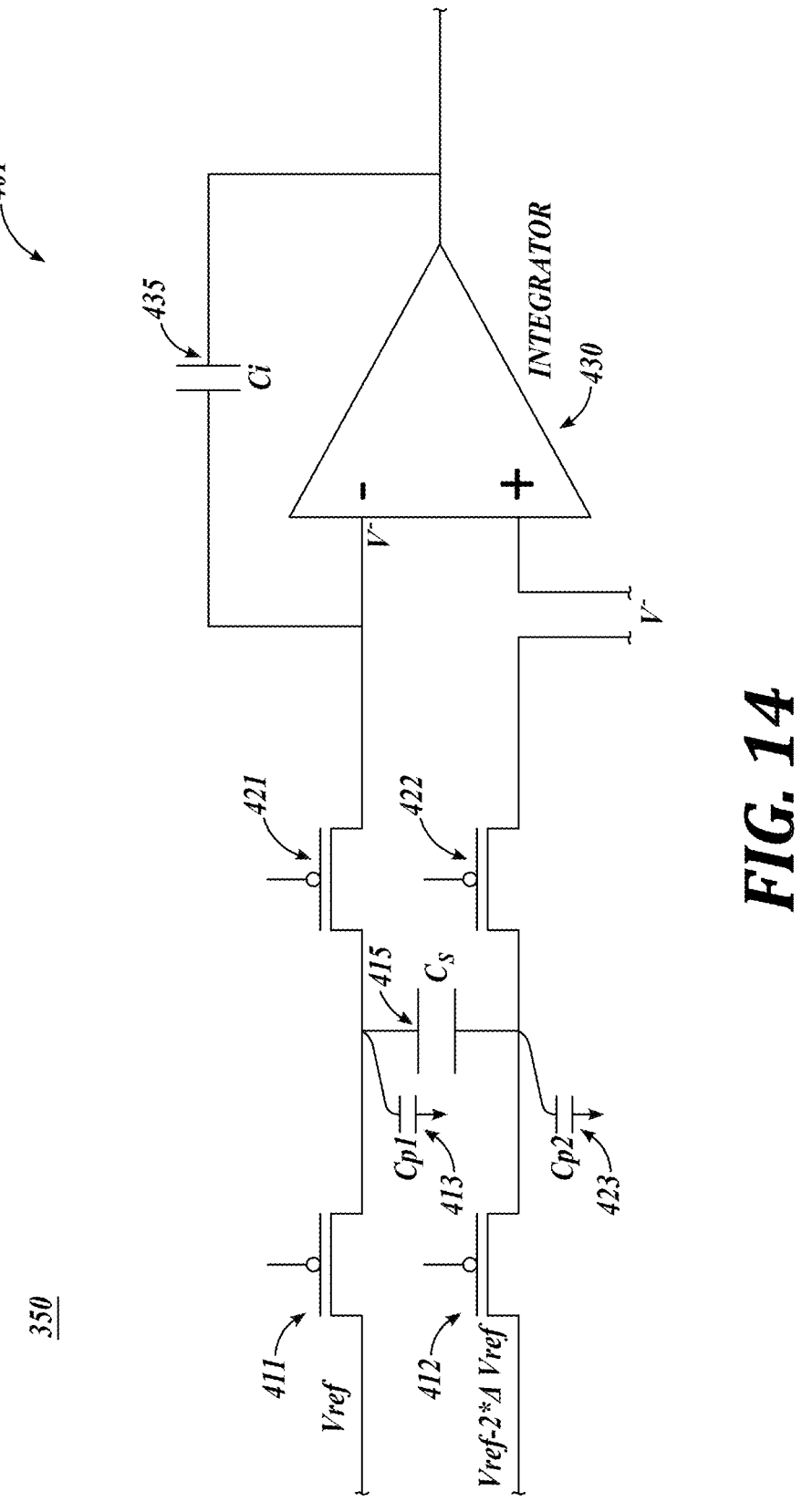
FIG. 14 illustrates voltage mismatch of a switched capacitor IDAC in accordance with an embodiment of the present technology.

FIG. 14 illustrates voltage mismatch of a switched capacitor IDAC in accordance with an embodiment of the present technology. For simplicity, one individual switch bank 410 is illustrated, but a person of ordinary skill will understand that more switch banks 410 may be added in a parallel arrangement. For example, 16 switch banks 410 or other number of switch banks may be included. As explained with respect to FIG. 11 above, the values of Vref, Vref-2*ΔVref, and V⁻ should be the same in absence of the voltage noise effects. However, under practical scenarios that include voltage noise, the above voltage values are not the same. Therefore, the value of 2*ΔVref has to be eliminated or at least trimmed in order to tune a slope of the switched capacitor IDAC, and also to adjust coarse gain and fine gain of the CDS operation. Embodiments of such trimming of the value of 2*ΔVref are illustrated with respect to FIGS. 15 and 16 below.

FIGS. 15 and 16 illustrate sample and hold phases, respectively, for buffers A, B, and C shown in FIG. 9. During the sample phase illustrated in FIG. 15, a voltage source 446 generates voltage Vos (V offset) based on voltage mismatches and gain errors of the op-amp 430. These Vos voltage errors are sampled and saved as the voltage Vos by an offset capacitor 445. During the hold phase illustrated in FIG. 16, the offset capacitor 445 applies the voltage Vos in the opposite direction to compensate the voltage offset, thus eliminating or at least reducing the voltage mismatches and offsets.

Figure 17:
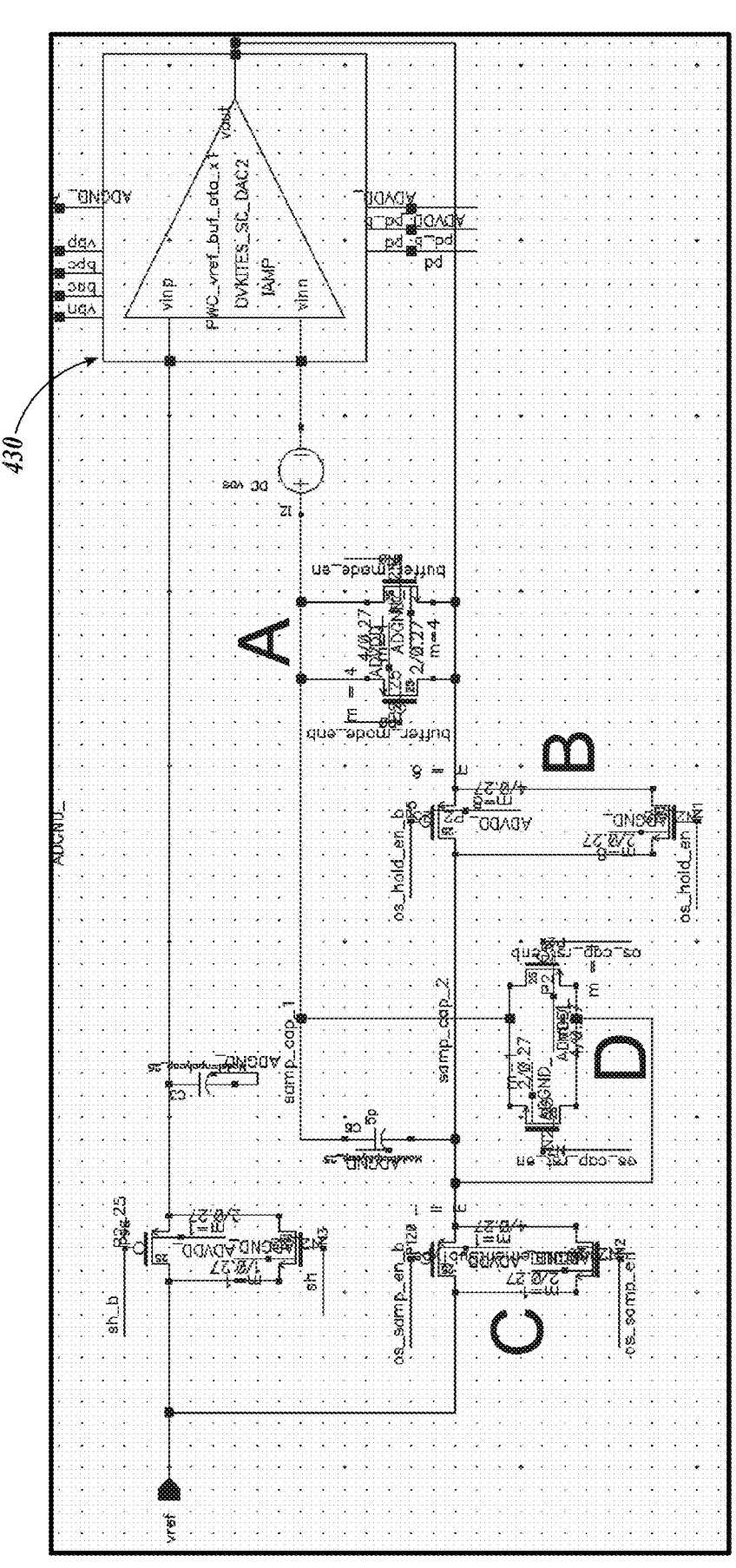
FIG. 17 is a schematic diagram of an example implementation of FIGS. 15 and 16.

FIG. 17 is a schematic diagram of an example implementation of FIGS. 15 and 16. The schematic illustrated schematics diagram was used for the output voltage simulation of the switched capacitor IDAC. In some embodiments, buffers A, B and/or C can have voltage offset because the opamps inside these buffers introduce the voltage offset due to the differential pair mismatches and loading output voltage dropout. However, different offset compensation techniques may be used to cancel the offsets and to make the voltage of buffers A, B, and/or C more accurate. The simulation diagram includes buffers A, B, and C that are explained with reference to FIG. 9.

Figure 18:
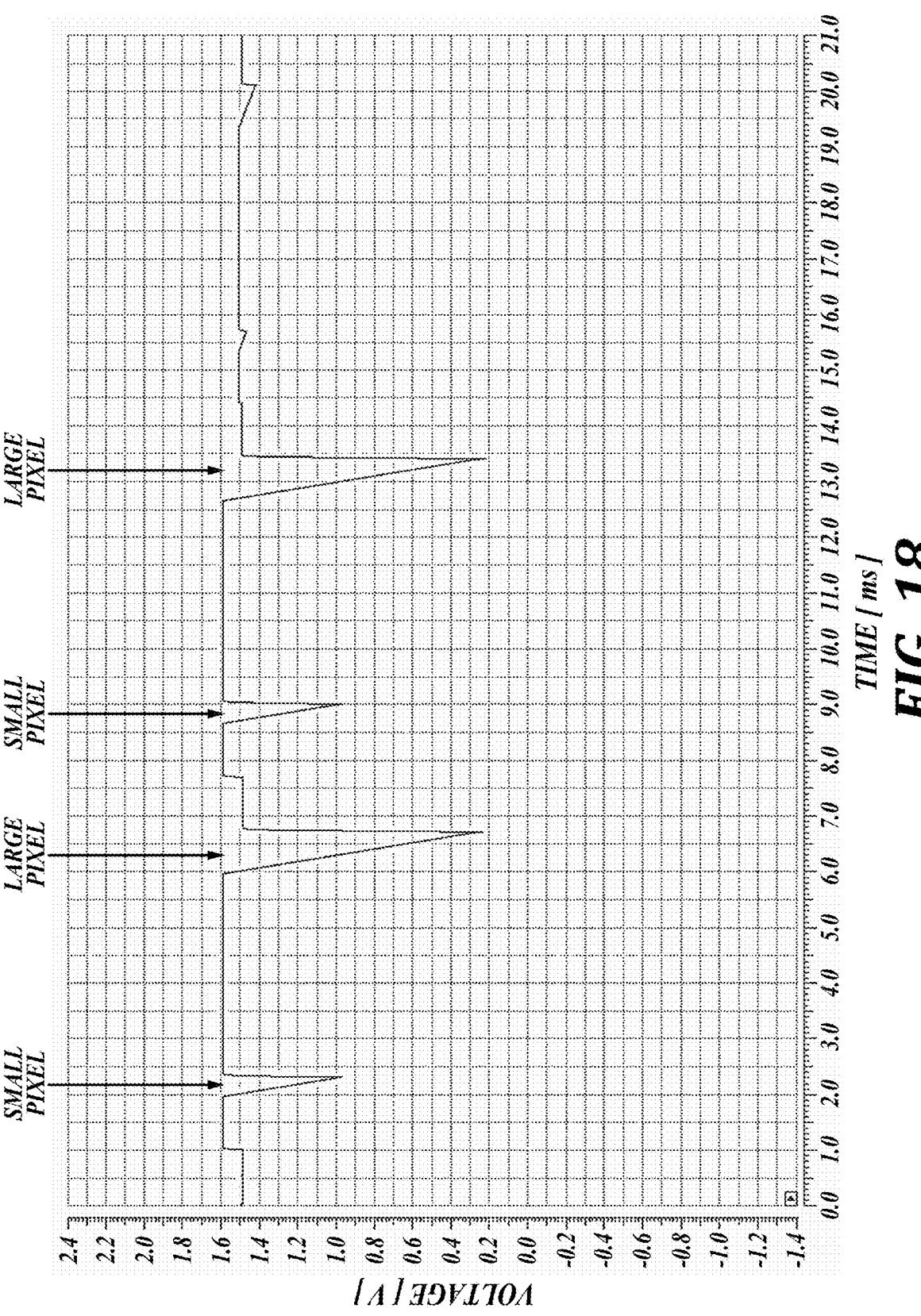
FIG. 18 is a diagram of double sampling for small and large pixels in accordance with an embodiment of the present technology.

FIG. 18 is a diagram of double sampling for small and large pixels in accordance with an embodiment of the present technology. The horizontal axis shows time in μs, and the vertical axis shows voltage in Volts. With the illustrated embodiment, the image sensor includes large pixels that generally improve dynamic range of the image sensor and small pixels that generally improve light sensitivity of the image sensor. Before the ramp down area, the flat area indicates that buffers A, B and C of FIG. 15 are in-phase and then these buffers are again in-phase as shown in FIG. 16. The buffers sample their individual offset errors in the "sample" phase of FIG. 15 to compensate the offset in the "hold" phase of FIG. 16. As a result, before the ramp-down the circuit provides accurate voltage after compensation and during the ramp-down the circuit still provides an accurate ramp-down slope rate.

In the illustrated embodiment, the CDS operation was simulated with AVDD being 2.2 V. Current for the integrator 401 is estimated at about 12 mA. The slope of the ramp rate is 1.78 mV/s, and the slopes are the same for both conversions (small pixels and large pixels). The simulation results indicate relatively good accuracy of the CDS operation, with the maximum gain error of 0.451% and the output CDS noise of 6.1 μV rms value, which, in many embodiments, are considered as relatively low values of gain error and output noise.

Many embodiments of the technology described above may take the form of a computer or controller-executable instructions, including routines executed by a programmable computer or controller. Those skilled in the relevant art will appreciate that the technology can be practiced on computer/ controller systems other than those shown and described above. The technology can be embodied in a special-purpose computer, application specific integrated circuit (ASIC), controller or data processor that is specifically programmed, configured, or constructed to perform one or more of the computer-executable instructions described above. Of course, any logic or algorithm described herein can be implemented in software or hardware or a combination of software and hardware.

The above description of illustrated examples of the invention, including what is described in the Abstract is not intended to be exhaustive or to limit the invention to the precise forms disclosed. As used herein, the terms "about," "generally," "approximately," and similar indicate that the subject value can be modified by plus or minus 5% and still fall within the disclosed embodiment. While specific examples of the invention are described herein for illustrative purposes, various modifications are possible within the scope of the invention, as those skilled in the relevant art will recognize. These modifications can be made to the invention in light of the above detailed description. The terms used in the following claims should not be constructed to limit the invention to the specific examples disclosed in the specification, Rather the scope of the invention is to be determined entirely by the following claims, which are to be construed in accordance with established doctrines of claim interpretation.

What is claimed is:

1. An image sensor, comprising:
a plurality of pixels arranged in rows and columns of a pixel array;
a bitline electrically coupled to a pixel; and
a switched capacitor current digital to analog converter (IDAC) coupled to the bitline, the IDAC comprising:
a plurality of switch banks, each switch bank configured to receive a control signal for controlling opening and closing of switches of the switch bank, wherein control signals are offset in time; and
an integrator coupled to the plurality of switch banks, wherein the integrator is configured for generating an output signal based on input signals received from the plurality of switch banks,
wherein a time offset between the control signals for two switch banks of the plurality of switch banks satisfies:

$$\Delta T = T/N,$$

where T is a period of the control signal, and N is a number of switch banks of the plurality of switch banks.

2. The image sensor of claim 1, wherein each switch bank is configured to generate a peak current that is offset by $\Delta T$ from a next peak current.

3. The image sensor of claim 1, wherein each switch bank comprises a first switch, a second switch, a third switch, and a fourth switch, wherein the first switch and the second switch are controlled by a first control signal, wherein the third switch and the fourth switch are controlled by a second control signal, and wherein a first phase of the first control signal differs by $\pi$ from a second phase of the second control signal.

4. The image sensor of claim 3, wherein each switch bank comprises a channel sample capacitor.

5. The image sensor of claim 4, wherein the integrator comprises:

an op-amp; and
an integrator capacitor.

6. The image sensor of claim 5, wherein each switch bank comprises a first buffer coupled to the first switch, a second buffer coupled to the second switch, and a third buffer coupled between an inverting input and a non-inverting input of the op-amp,
wherein each first buffer is configured for providing a first differential voltage reference Vref1 to the first switch, each second buffer is configured for providing a second differential voltage references Vref2 to the second switch, and wherein the voltage references Vref1 and Vref2 are configured for charging the channel sample capacitor.

7. The image sensor of claim 5, wherein a capacitance of the integrator capacitor is an order of magnitude greater than a capacitance of the channel sample capacitor.

8. The image sensor of claim 4, wherein the channel sample capacitor is a Metal-Oxide-Metal (MOM) interdigitated capacitor.

9. The image sensor of claim 8, wherein the channel sample capacitor comprises:
a first plate and a second plate that are interdigitated in a first metal layer; and
an electrical connection between the first plate of the channel sample capacitor and the second metal layer.

10. A method of a correlated double sampling (CDS) readout of an image sensor having a plurality of pixels of a pixel array, the method comprising:
exposing a pixel to light;
coupling the pixel to a bitline through a select transistor (SEL);
generating a ramp voltage by a switched capacitor current digital to analog converter (IDAC) coupled to the bitline, wherein generating the ramp voltage comprises:
controlling opening and closing of switches of a plurality of switch banks by control signals, wherein each switch bank is configured for receiving a control signal, and wherein the control signals are offset in time; and
receiving, by an integrator, a plurality of current inputs generated by the plurality of switch banks; and
generating an output signal by the integrator; and
determining at least one comparator flip by finding an intersection between the ramp voltage and a pixel voltage from the pixel,
wherein a time offset between the control signals for two switch banks of the plurality of switch banks satisfies:

$$\Delta T = T/N,$$

where T is a period of the control signal, and N is a number of switch banks of the plurality of switch banks.

11. The method of claim 10, further comprising generating, by each switch bank, a peak current that is offset by $\Delta T$ from a next peak current.

12. The method of claim 10, wherein each switch bank comprises a first switch, a second switch, a third switch, and a fourth switch, the method further comprising:
controlling the first switch and the second switch by a first control signal; and
controlling the third switch and the fourth switch by a second control signal,
wherein a first phase of the first control signal differs by $\pi$ from a second phase of the second control signal.

13. The method of claim 12, wherein each switch bank comprises a channel sample capacitor.

14. The method of claim 13, wherein each switch bank comprises a first buffer coupled to the first switch, and a second buffer coupled to the second switch, the method further comprising:

providing a first differential voltage reference Vref1 to the first switch of each switch bank;

providing a second differential voltage references Vref2 to the second switch of each switch bank; and charging the channel sample capacitor by the voltage references Vref1 and Vref2.

15. The method of claim 13, wherein the integrator comprises:

an op-amp; and an integrator capacitor.

16. The method of claim 15, wherein each switch bank comprises a third buffer coupled between an inverting input and a non-inverting input of an op-amp of the integrator.

17. The image sensor of claim 15, wherein a capacitance of the integrator capacitor is an order of magnitude greater than a capacitance of the channel sample capacitor.

18. The method of claim 13, wherein the channel sample capacitor is a Metal-Oxide-Metal (MOM) interdigitated capacitor.

19. The image sensor of claim 18, wherein the channel sample capacitor comprises a first plate and a second plate that are interdigitated in a first metal layer, and an electrical connection between the first plate of the channel sample capacitor and the second metal layer.

* * * * *